United States Patent
Yamada et al.

(10) Patent No.: US 10,461,055 B2
(45) Date of Patent: Oct. 29, 2019

(54) CU ALLOY CORE BONDING WIRE WITH PD COATING FOR SEMICONDUCTOR DEVICE

(71) Applicants: NIPPON MICROMETAL CORPORATION, Saitama (JP); NIPPON STEEL CHEMICAL & MATERIAL CO., LTD., Tokyo (JP)

(72) Inventors: Takashi Yamada, Saitama (JP); Daizo Oda, Saitama (JP); Teruo Haibara, Saitama (JP); Tomohiro Uno, Tokyo (JP)

(73) Assignees: NIPPON MICROMETAL CORPORATION, Saitama (JP); NIPPON STEEL CHEMICAL & MATERIAL CO., LTD., Tokyo (JP)

(*) Notice: Subject to any disclaimer, the term of this patent is extended or adjusted under 35 U.S.C. 154(b) by 0 days.

(21) Appl. No.: 16/248,531

(22) Filed: Jan. 15, 2019

(65) Prior Publication Data

US 2019/0164927 A1 May 30, 2019

Related U.S. Application Data

(63) Continuation of application No. 15/107,423, filed as application No. PCT/JP2015/076721 on Sep. 18, 2015, now Pat. No. 10,236,272.

(30) Foreign Application Priority Data

May 26, 2015 (JP) .................................. 2015-106368
Jun. 5, 2015 (WO) .................. PCT/JP2015/066392

(51) Int. Cl.
*H01L 23/00* (2006.01)

(52) U.S. Cl.
CPC .... *H01L 24/45* (2013.01); *H01L 2224/05624* (2013.01); *H01L 2224/45015* (2013.01);
(Continued)

(58) Field of Classification Search
CPC ........... H01L 24/45; H01L 2224/45565; H01L 2224/05624; H01L 2224/45655
See application file for complete search history.

(56) References Cited

U.S. PATENT DOCUMENTS 3,528,803 A 9/1970 Ichikawa et al.
4,469,567 A 9/1984 Torday et al.
(Continued)

FOREIGN PATENT DOCUMENTS

CN 102422404 A 4/2012
CN 2013192789 U 9/2013
(Continued)

OTHER PUBLICATIONS

Japanese Notice of Rejection dated Mar. 1, 2016, issued in Japanese Application No. 2015-548080. (w/ English translation).
(Continued)

*Primary Examiner* — Dale E Page
*Assistant Examiner* — Wilner Jean Baptiste
(74) *Attorney, Agent, or Firm* — McDermott Will & Emery LLP

(57) ABSTRACT

A bonding wire for a semiconductor device includes a Cu alloy core material and a Pd coating layer formed on a surface thereof, and the boding wire contains one or more elements of As, Te, Sn, Sb, Bi and Se in a total amount of 0.1 to 100 ppm by mass. The bonding longevity of a ball bonded part can increase in a high-temperature and high-humidity environment, improving the bonding reliability. When the Cu alloy core material further contains one or more of Ni, Zn, Rh, In, Ir, Pt, Ga and Ge in an amount, for (Continued)

each, of 0.011 to 1.2% by mass, it is able to increase the reliability of a ball bonded part in a high-temperature environment of 170° C. or more. When an alloy skin layer containing Au and Pd is further formed on a surface of the Pd coating layer, wedge bondability improves.

21 Claims, 1 Drawing Sheet

(52) U.S. Cl.
CPC ............... *H01L 2224/45147* (2013.01); *H01L 2224/45565* (2013.01); *H01L 2224/45572* (2013.01); *H01L 2224/45609* (2013.01); *H01L 2224/45618* (2013.01); *H01L 2224/45644* (2013.01); *H01L 2224/45647* (2013.01); *H01L 2224/45655* (2013.01); *H01L 2224/45664* (2013.01); *H01L 2224/45669* (2013.01); *H01L 2224/45673* (2013.01); *H01L 2224/45678* (2013.01); *H01L 2224/48011* (2013.01); *H01L 2224/48247* (2013.01); *H01L 2224/48507* (2013.01); *H01L 2224/85065* (2013.01); *H01L 2224/85075* (2013.01); *H01L 2224/85439* (2013.01); *H01L 2924/10253* (2013.01); *H01L 2924/1576* (2013.01)

(56) References Cited

U.S. PATENT DOCUMENTS

| | | | |
|---|---|---|---|
| 4,708,739 A | | 11/1987 | Kellie et al. |
| 6,140,583 A | * | 10/2000 | Suzuki ................. H01L 24/45 174/250 |
| 6,159,623 A | | 12/2000 | Tanaka |
| 8,389,860 B2 | | 3/2013 | Uno et al. |
| 2005/0151253 A1 | * | 7/2005 | Nonaka ................. H01L 24/43 257/741 |
| 2009/0127317 A1 | | 5/2009 | Siepe et al. |
| 2009/0188696 A1 | | 7/2009 | Uno et al. |
| 2011/0011619 A1 | | 1/2011 | Uno et al. |
| 2011/0120594 A1 | * | 5/2011 | Uno ................. B32B 15/018 148/23 |
| 2012/0118610 A1 | | 5/2012 | Terashima et al. |

FOREIGN PATENT DOCUMENTS

| | | |
|---|---|---|
| CN | 103339719 A | 10/2013 |
| CN | 104241237 A | 12/2014 |
| EP | 1 677 345 A1 | 7/2006 |
| JP | S52-23969 B1 | 6/1977 |
| JP | S60160554 U | 10/1985 |
| JP | S61-20693 A | 1/1986 |
| JP | S61-48543 A | 3/1986 |
| JP | S61-52332 A | 3/1986 |
| JP | S61-52333 A | 3/1986 |
| JP | S61-255045 A | 11/1986 |
| JP | S62-130248 A | 6/1987 |
| JP | H01-263289 A | 10/1989 |
| JP | 2004-064033 A | 2/2004 |
| JP | 2005-167020 A | 6/2005 |
| JP | 2006-100777 A | 4/2006 |
| JP | 2011-035020 A | 2/2011 |
| JP | 2011-077254 A | 4/2011 |
| JP | 2012-036490 A | 2/2012 |
| JP | 4958249 B2 | 6/2012 |
| JP | 2012-222194 A | 11/2012 |
| JP | 2013-172032 A | 9/2013 |
| JP | 2015-002213 A | 1/2015 |
| KR | 10-2004-0073667 A | 8/2004 |
| KR | 10-2010-0032451 A | 3/2010 |
| TW | 201205695 A | 2/2012 |
| TW | 201511150 A | 3/2015 |
| WO | 2009/072525 A1 | 6/2009 |
| WO | 2011/013527 A1 | 2/2011 |
| WO | 2011/118009 A1 | 9/2011 |
| WO | 2013/094482 A1 | 6/2013 |

OTHER PUBLICATIONS

Japanese Decision of Patent Grant dated Apr. 12, 2016, issued in Japanese Application No. 2015-548080. (w/ English translation).
International Search Report dated Dec. 15, 2016, issued in International Application No. PCT/JP2015/076721.
Office Action issued in corresponding Korean Application No. 10-2016-7011740, dated Oct. 30, 2016.
Taiwanese Office Action dated Feb. 8, 2017 issued in Taiwanese Patent Application No. 105121817.
Office Action issued in corresponding German Patent Application No. 112015004364.0, dated May 16, 2017.
In-Tae Bae et al., "Comprehensive Intermetallic Compound Phase Analysis and Its Thermal Evolution at Cu Wirebond Interface", 2014 IEEE 64th Electronic Components and Technology Conference (ECTC), IEEE, pp. 1562-1570 (May 27, 2014).
Partial Supplementary European Search Report issued in corresponding EP Patent Application No. 15874396.3, dated Oct. 5, 2017.
Office Action issued in corresponding Chinese Patent Application No. 201580002533.6, dated Oct. 9, 2017.
Notice of Reasons for Revocation of a Patent issued in Opposition No. 2016-70167 (Japanese Patent No. 5937770) mailed Apr. 19, 2017 (with English translation).
Decision on Opposition issued in Opposition No. 2016-701167 (Japanese Patent No. 5937770) mailed Aug. 8, 2017 (with English translation).
"Copper billets and cakes," JIS H2123, Japanese Statndard Association (ASA), Oct. 20, 1999, pp. 1-11.
Butts, Allison. "COPPER: The Science and Technology of the Metal, Its Alloys and Compounds,", American Chemical Society Monograph Series (1954), pp. 214, 216, 218.
Kato, Masanori. "Specific Characteristics and Uses of Ultrahigh-purity Copper", Journal of the Japan Copper and Brass Research Association. col. 35. (1996), pp. 28-35 (with partial translation).
Morinaga, Takuichi. "Copper and coppery alloy," pp. 2-7, Kyoritsu Shuppan, 1954.
Notification of Reasons for Refusal issued in Japanese Patent Application No. 2016-096235 dated Jan. 23, 2018.
Miyake, Yasuhiko. "Recent Aspects on Manufacturing Method and Applications of Super Pure Copper for Industrial Use," Bulletin of the Japan Institute of Metals, vol. 31, Issue 4 (1992), pp. 267-276 (with partial English translation).
Extended European Search Report issued in European Application No. 15874396.3 dated Jan. 31, 2018.
Decision to Grant a Patent issued in the corresponding Japanese Application No. 2016-096235, dated May 22, 2018. (with English translation).
Taiwanese Decision to Grant a Patent issued in corresponding Taiwanese Patent Application No. 107114049, dated Oct. 26, 2018, with English Translation.
Non-Final Office Action dated Mar. 24, 2017, issued in parent U.S. Appl. No. 15/107,423.
Non-Final Office Action dated Sep. 7, 2017, issued in parent U.S. Appl. No. 15/107,421.
Final Office Action dated Apr. 13, 2018, issued in parent U.S. Appl. No. 15/107,423.
Notice of Allowance dated Oct. 24, 2018, issued in parent U.S. Appl. No. 15/107,423.
Corrected Notice of Allowability dated Jan. 8, 2019, issued in parent U.S. Appl. No. 15/107,421.

* cited by examiner

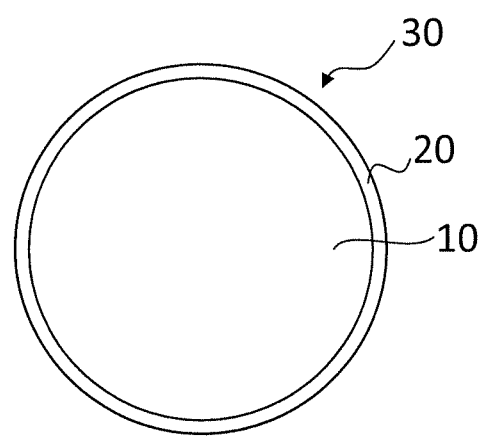

CU ALLOY CORE BONDING WIRE WITH PD COATING FOR SEMICONDUCTOR DEVICE

CROSS-REFERENCE TO RELATED APPLICATIONS

This application is a continuation of U.S. patent application Ser. No. 15/107,423 filed Jun. 22, 2016, which is the U.S. National Phase of PCT/JP2015/076721 filed Sep. 18, 2015, which claims priority to Japanese Patent Application No. 2015-106368 filed May 26, 2015 and International Application No. PCT/JP2015/066392 filed Jun. 5, 2015. The subject matter of each is incorporated herein by reference in entirety.

TECHNICAL FIELD

The present invention relates to a bonding wire for a semiconductor device used to connect electrodes on a semiconductor device and wiring of a circuit wiring board such as external leads.

BACKGROUND ART

As a bonding wire for a semiconductor device which connects electrodes on a semiconductor device and external leads (hereinafter referred to as a "bonding wire"), a thin wire with a wire diameter of about 15 to 50 μm is mainly used today. For a bonding method with bonding wire, there is generally used a thermal compressive bonding technique with the aid of ultrasound, in which a general bonding device, a capillary tool used for bonding by passing a bonding wire therethrough, and the like are used. A bonding process of a bonding wire is carried out by heating and melting a tip of wire by arc heat input to form a ball (FAB: free air ball) through surface tension; crimp-bonding the ball part onto an electrode of the semiconductor device heated within a range of 150 to 300° C. (hereinafter referred to as "ball bonding"); forming a loop; and finally crimp-bonding a wire part onto an electrode of the external lead (hereinafter referred to as "wedge bonding"). For the electrode on the semiconductor device as an object to be bonded with the bonding wire, there is used an electrode structure in which a film of alloy mainly containing Al is formed on a Si substrate. For the electrode of the external lead, there is used an electrode structure with Ag plating or Pd plating.

Although Au has been mainly used for a material of the bonding wire, a replacement of Au with Cu is being conducted mainly in LSI use. On the background of recent proliferation of electric vehicles and hybrid vehicles, needs for replacing Au with Cu are increasing also in on-vehicle device use.

As for a Cu bonding wire, there has been proposed a wire using high-purity Cu (purity: 99.99% by mass or more) (for example, Patent Literature 1). Cu has the drawback of being more susceptible to oxidation than Au and has problems in that bonding reliability, ball formability and wedge bondability are inferior. As a method for preventing surface oxidation of a Cu bonding wire, there has been proposed a structure in which a surface of Cu core material is coated with a metal such as Au, Ag, Pt, Pd, Ni, Co, Cr and Ti (Patent Literature 2). There has been also proposed a structure in which a surface of Cu core material is coated with Pd and a surface thereof is coated with Au, Ag, Cu or an alloy thereof (Patent Literature 3).

RELATED ART REFERENCE

Patent Literature

Patent Literature 1: JP-A-S61-48543
Patent Literature 2: JP-A-2005-167020
Patent Literature 3: JP-A-2012-36490

SUMMARY OF INVENTION

Problem to be Solved by the Invention

In comparison to general electronic devices, on-vehicle devices require bonding reliability in a rigorous high-temperature and high-humidity environment. In particular, the biggest concern is a bonding longevity of a ball bonded part that is formed by bonding a ball of wire to an electrode. Some methods are developed for evaluating the bonding reliability in a high-temperature and high-humidity environment, and a representative evaluation method includes a highly accelerated temperature and humidity stress test (HAST) (a high-temperature and high-humidity environment exposure test). When a bonding reliability of a ball bonded part is evaluated by HAST, a ball bonded part to be evaluated is exposed to a high-temperature and high-humidity environment with a temperature of 130° C. and a relative humidity of 85%, and then, the bonding longevity of the ball bonded part is evaluated by measuring temporal changes in a resistance value of the bonded part or by measuring temporal changes in shear strength of the ball bonded part. There has been recently required a bonding longevity of 100 hours or more in HAST with such conditions.

It has been revealed that, in a case when a conventional Cu bonding wire having a Pd coating layer is used to perform a bonding operation with a pure Al electrode where 1st bonding is ball bonding and 2nd bonding is wedge bonding, followed by performing a sealing operation with an epoxy resin and evaluating a resulting ball bonded part in the above mentioned HAST condition, the bonding longevity of the ball bonded part may be less than 100 hours, and the bonding reliability thereof is not sufficient for on-vehicle devices.

An object of the present invention is to provide a Cu bonding wire having a Pd coating layer on a surface thereof, that improves bonding reliability of a ball bonded part in a high-temperature and high-humidity environment and is suitable for on-vehicle devices.

BRIEF DESCRIPTION OF THE DRAWINGS

FIG. 1 is a cross sectional view of a bonding wire according to one embodiment of the present disclosure.

MEANS FOR SOLVING PROBLEM

The present invention employs the following structures.
(1) A bonding wire for a semiconductor device comprising: a Cu alloy core material; and a Pd coating layer formed on a surface of the Cu alloy core material, wherein the bonding wire contains at least one or more elements selected from As, Te, Sn, Sb, Bi and Se, a concentration of the elements in total is 0.1 to 100 ppm by mass relative to the entire wire, and Sn≤10 ppm by mass; Sb≤10 ppm by mass; and Bi≤1 ppm by mass.
(2) The bonding wire for a semiconductor device according to (1), wherein the concentration of the at least one or more elements selected from As, Te, Sn, Sb, Bi and Se in total is 1 to 100 ppm by mass relative to the entire wire. (3) The bonding wire for a semiconductor device according to (1) or (2), wherein a thickness of the Pd coating layer is 0.015 to 0.150 μm.
(4) The bonding wire for a semiconductor device according to any one of (1) to (3), further comprising an alloy skin layer containing Au and Pd on the Pd coating layer.
(5) The bonding wire for a semiconductor device according to (4), wherein a thickness of the alloy skin layer containing Au and Pd is 0.0005 to 0.050 μm.
(6) The bonding wire for a semiconductor device according to any one of (1) to (5), wherein the bonding wire further contains at least one or more elements selected from Ni, Zn, Rh, In, Ir, Pt, Ga and Ge, and a concentration of each of the elements is 0.011 to 1.2% by mass relative to the entire wire.
(7) The bonding wire for a semiconductor device according to any one of (1) to (6), wherein the Cu alloy core material contains Pd, and a concentration of Pd contained in the Cu alloy core material is 0.05 to 1.2% by mass.
(8) The bonding wire for a semiconductor device according to any one of (1) to (7), wherein the bonding wire further contains at least one or more elements selected from B, P, Mg, Ca and La, and a concentration of each of the elements is 1 to 100 ppm by mass relative to the entire wire.
(9) The bonding wire for a semiconductor device according to any one of (1) to (8), wherein, in a measurement result when measuring crystal orientations on a surface of the bonding wire, a crystal orientation <111> angled at 15 degrees or less to a longitudinal direction of the bonding wire has a proportion of 30 to 100% in terms of areal percentage.
(10) The bonding wire for a semiconductor device according to any one of (1) to (9), wherein Cu is present at an outermost surface of the bonding wire.

Effect of the Invention

The present invention is a bonding wire for a semiconductor device which includes a Cu alloy core material and a Pd coating layer formed on a surface of the Cu alloy core material. The bonding wire contains at least one or more elements selected from As, Te, Sn, Sb, Bi and Se in a total amount of 0.1 to 100 ppm by mass, and thereby, the present invention increases a bonding longevity of a ball bonded part in a high-temperature and high-humidity environment and can improve bonding reliability.

Embodiment for Carrying Out the Invention

FIG. 1 exemplarily shows a bonding wire 30 for a semiconductor device including a Cu alloy core material 10 and a Pd coating layer 20 formed on a surface of the Cu alloy core material 10, wherein the bonding wire contains at least one or more elements selected from As, Te, Sn, Sb, Bi and Se in a total amount of 0.1 to 100 ppm by mass. The bonding wire 30 having the specific configuration can improve the bonding reliability of a ball bonded part in a high-temperature and high-humidity environment required for on-vehicle devices.

Although details will be described below, when a ball is formed using the boding wire of the present invention by arc discharge, an alloy layer having a higher Pd concentration than an inside of the ball is formed in a surface of the ball during the process when the bonding wire melts and solidifies. Such ball is used to bond with an Al electrode and a high-temperature and high-humidity test is performed, which allows Pd to be concentrated at a bonding interface.

A concentrated layer formed by the concentrated Pd can reduce a diffusion of Cu and Al at a bonding interface during a high-temperature and high-humidity test and can reduce a growth rate of corrodible compound. It is thus able to significantly improve the bonding reliability of a ball bonded part in a high-temperature and high-humidity environment.

The alloy layer with a high Pd concentration formed on a surface of the ball is excellent in oxidation resistance and can thereby reduce failures such as deviation of a ball forming position relative to a center of the bonding wire at the time of ball formation.

In view of increasing the bonding longevity of a ball bonded part in a high-temperature and high-humidity environment of a temperature of 130° C. and a relative humidity of 85% to improve the bonding reliability, the concentration of at least one or more elements selected from As, Te, Sn, Sb, Bi and Se in total, relative to the entire bonding wire, is 0.1 ppm by mass or more, preferably 0.5 ppm by mass or more, more preferably 1 ppm by mass or more, and further preferably 1.5 ppm by mass or more, 2 ppm by mass or more, 2.5 ppm by mass or more, or 3 ppm by mass or more.

A mold resin (an epoxy resin) as a package of a semiconductor device contains chlorine (Cl) in its molecular skeleton. In a high-temperature and high-humidity environment of a temperature of 130° C. and a relative humidity of 85% as a HAST evaluation condition, Cl in the molecular skeleton hydrolyzes and dissolves as a chloride ion (Cl$^-$). In a case where a Cu bonding wire having no coating layer is bonded to an Al electrode, when a Cu/Al bonding interface is placed in high temperature, Cu and Al mutually diffuse, and $Cu_9Al_4$ as an intermetallic compound is finally formed. $Cu_9Al_4$ is susceptible to corrosion by halogen and undergoes corrosion by chloride dissolved from the mold resin, leading to degradation in the bonding reliability. In a case where a Cu wire has a Pd coating layer, a bonding interface between the Pd-coated Cu wire and the Al electrode has a structure of Cu/Pd-concentrated layer/Al, whereby a formation of the $Cu_9Al_4$ intermetallic compound is reduced compared with a case of the Cu wire having no coating layer, but it is still insufficient in a bonding reliability in a high-temperature and high-humidity environment required for on-vehicle devices.

In contrast, it is considered that when a Pd-coated Cu bonding wire contains at least one or more elements selected from As, Te, Sn, Sb, Bi and Se in a certain amount as in the present invention, a formation of a $Cu_9Al_4$ intermetallic compound in the bonded part tends to be further reduced. In a case where these elements are contained in a certain amount, when a ball is formed, interfacial tension between Cu of the core material and Pd of the coating layer decreases and then interfacial wettability improves, which allows Pd to be concentrated in a ball bonded interface more remarkably. It can be thus estimated that an effect of reducing a mutual diffusion of Cu and Al by the Pd concentrated layer is further enhanced, and as a result of that, a formation amount of $Cu_9Al_4$, which is likely to corrode through the action of Cl, is reduced, and then the bonding reliability of the ball bonded part in a high-temperature and high-humidity environment significantly improves.

In the present invention including a Cu alloy core material, a Pd coating layer formed on the surface of the Cu alloy core material, and further a skin alloy layer containing Au and Pd on a surface thereof as needed, when diffusion heat treatment or annealing heat treatment is performed as described below, Cu of the core material diffuses through the coating layer and the skin alloy layer by grain boundary diffusion or the like, thereby enabling Cu to reach an outermost surface of the wire and allows Cu to be present at the outermost surface. Accordingly, in the present invention, Cu may be present at an outermost surface of the boding wire.

In a case where a Pd-coated Cu bonding wire contains As, Te, Sn, Sb, Bi and Se in a certain amount as in the present invention, if Cu is further present at an outermost surface of the bonding wire, the formation of the $Cu_9Al_4$ intermetallic compound in a bonded part tends to be further reduced. In the Pd-coated Cu bonding wire containing As, Te, Sn, Sb, Bi and Se in a certain amount, if Cu is further present at an outermost surface of the bonding wire, interaction between As, Te, Sn, Sb, Bi and Se and Cu contained in the bonding wire promotes a concentration behavior of Pd on a surface of FAB during formation of FAB, which allows Pd to be concentrated in a ball bonded interface more remarkably. It can be thus estimated that an effect of reducing a mutual diffusion of Cu and Al by the Pd concentrated layer is further enhanced, and a formation amount of $Cu_9Al_4$, which is likely to corrode through the action of Cl, is reduced, thereby further improving the bonding reliability of the ball bonded part in a high-temperature and high-humidity environment.

When a surface of bonding wire is measured by an Auger electron spectroscopic apparatus, if Cu is detected on the surface, it can be determined that Cu is present at an outermost surface, and the above effect can be exhibited. Furthermore, it is preferable that a concentration of Cu is 1 at % or more relative to metallic elements constituting the outermost surface of bonding wire because an effect of improving the bonding reliability of a ball bonded part in a high-temperature and high-humidity environment can be surely exhibited. In view of further improving the bonding reliability of a ball bonded part in a high-temperature and high-humidity environment, a concentration of Cu relative to metallic elements constituting the outermost surface of the bonding wire is more preferably 1.5 at % or more, and further preferably 2 at % or more, 2.5 at % or more, or 3 at % or more. In view of reducing degradation of the oxidation resistance and the sulfur resistance of the wire surface to reduce degradation of the service life of the bonding wire, a concentration of Cu relative to metallic elements constituting the outermost surface of the bonding wire is preferably 50 at % or less, more preferably 45 at % or less, and further preferably 40 at % or less, 35 at % or less, or 30 at % or less.

The effect due to the presence of Cu on a surface tends to be exhibited when a purity of Cu of core material is low (3N or less, for example) and, in particular, tends to be exhibited more remarkably when a purity of Cu is 2N or less.

The effect of improving the bonding reliability of a ball bonded part in a high-temperature and high-humidity environment due to the presence of Cu at an outermost surface of bonding wire is unique to the bonding wire of the present invention containing As, Te, Sn, Sb, Bi and Se in a certain amount. A general Pd-coated Cu bonding wire containing none of these elements does not achieve the improvement effect as in the present invention in the bonding reliability of a ball bonded part in a high-temperature and high-humidity environment. On the contrary, in the general Pd-coated Cu bonding wire containing none of these elements, the presence of Cu at an outermost surface of bonding wire degrades the oxidation resistance and the sulfur resistance of the wire surface, and reduces the service life of the bonding wire. In addition, an eccentricity of FAB frequently occurs and a ball shape is likely to degrade. Furthermore, wedge bondability tends to degrade.

In the bonding wire of the present invention, the effect due to the presence of Cu at an outermost surface of bonding wire appears similarly in both a case in which a Pd coating layer is an outermost surface and a case in which an alloy skin layer containing Au and Pd is an outermost surface.

The outermost surface refers to a region of surface of the bonding wire to be measured by an Auger electron spectroscopic apparatus without performing sputtering or the like.

In view of obtaining favorable FAB shape and therefore obtaining favorable ball bondability, a concentration of the elements in total in the wire is 100 ppm by mass or less, and preferably 95 ppm by mass or less, 90 ppm by mass or less, 85 ppm by mass or less, or 80 ppm by mass or less. If a concentration of Sn or Sb exceeds 10 ppm by mass or if a concentration of Bi exceeds 1 ppm by mass, an FAB shape becomes faulty. It is therefore preferable for further improving an FAB shape that Sn≤10 ppm by mass; Sb≤10 ppm by mass; and Bi≤1 ppm by mass. Furthermore, a concentration of Se being 4.9 ppm by mass or less is more favorable in that an FAB shape and a wedge bondability can further improve.

As for addition of As, Te, Sn, Sb, Bi and Se into a bonding wire, the effect of the invention can be exhibited by employing either of a method of adding these elements into a Cu core material and a method of adding these elements therein by depositing these elements onto a Cu core material or a surface of wire. An amount of these elements to be added is infinitesimal and allows a wide variety of methods of addition, and the effect is exhibited by any method of addition so long as the components are contained in the designated concentration range.

In the bonding wire of the present invention, in view of further improving the bonding reliability of a ball bonded part in a high-temperature and high-humidity environment required for on-vehicle devices, a thickness of the Pd coating layer is preferably 0.015 μm or more, more preferably 0.02 μm or more, and further preferably 0.025 μm or more, 0.03 μm or more, 0.035 μm or more, 0.04 μm or more, 0.045 μm or more, or 0.05 μm or more. In view of obtaining favorable FAB shape, a thickness of the Pd coating layer is preferably 0.150 μm or less and more preferably 0.140 μm or less, 0.130 μm or less, 0.120 μm or less, 0.110 μm or less, or 0.100 μm or less.

There will be described the definition of the Cu alloy core material and the Pd coating layer of the bonding wire. A boundary between the Cu alloy core material and the Pd coating layer was determined based on a concentration of Pd. The boundary was set to be a position at which a concentration of Pd was 50 at %, and a region in which a concentration of Pd was 50 at % or more was determined to be the Pd coating layer, and a region in which a concentration of Pd was less than 50 at % was determined to be the Cu alloy core material. This is because if a concentration of Pd is 50 at % or more in the Pd coating layer, there can be expected an effect of improving characteristics from the structure of the Pd coating layer. The Pd coating layer may contain a region of a Pd single layer and a region having concentration gradients of Pd and Cu in a wire depth direction. The reason why the region having the concentration gradients is formed in the Pd coating layer is that atoms of Pd and Cu may diffuse through heat treatment or the like in a manufacturing process. In the present invention, the concentration gradient refers to the fact that a degree of a change in concentration in the depth direction is 10 mol % or more per 0.1 μm. Furthermore, the Pd coating layer may contain inevitable impurities.

The bonding wire of the present invention may further include an alloy skin layer containing Au and Pd on a surface of the Pd coating layer. With this configuration, the bonding wire of the present invention can further increase the bonding reliability and can improve the wedge bondability.

There will be described the definition of the alloy skin layer containing Au and Pd of the bonding wire. A boundary between the alloy skin layer containing Au and Pd and the Pd coating layer was determined based on a concentration of Au. The boundary was set to be a position at which a concentration of Au was 10 at %, and a region in which a concentration of Au was 10 at % or more was determined to be the alloy skin layer containing Au and Pd, and a region in which a concentration of Au was less than 10 at % was determined to be the Pd coating layer. Even in the region in which a concentration of Pd was 50 at % or more, a region in which Au was present at 10 at % or more was determined to be the alloy skin layer containing Au and Pd. These determinations are because if a concentration of Au falls within the range mentioned above, there can be expected an effect of improving characteristics from the structure of the Au skin layer. The alloy skin layer containing Au and Pd is a Au—Pd alloy and includes both a case where it contains a region having concentration gradients of Au and Pd in the wire depth direction and a case where it does not contain the region having the concentration gradients. It is preferable that the alloy skin layer containing Au and Pd contains the region having the concentration gradients. The reason why the region having the concentration gradients is formed in the alloy skin layer containing Au and Pd is that atoms of Au and Pd diffuse through heat treatment or the like in the manufacturing process. Furthermore, the alloy skin layer containing Au and Pd may contain inevitable impurities and Cu.

In the bonging wire of the present invention, the alloy skin layer containing Au and Pd reacts with the Pd coating layer to improve adhesive strength among the alloy skin layer containing Au and Pd, the Pd coating layer and the Cu alloy core material and to prevent the Pd coating layer and the alloy skin layer containing Au and Pd from peeling at the time of wedge bonding. Accordingly, the bonding wire of the present invention can improve the wedge bondability. In view of obtaining favorable wedge bondability, a thickness of the alloy skin layer containing Au and Pd is preferably 0.0005 μm or more, and more preferably 0.001 μm or more, 0.002 μm or more, or 0.003 μm or more. In view of reducing eccentricity to obtain favorable FAB shape, a thickness of the alloy skin layer containing Au and Pd is preferably 0.050 μm or less, and more preferably 0.045 μm or less, 0.040 μm or less, 0.035 μm or less, or 0.030 μm or less. The alloy skin layer containing Au and Pd can be formed by a method similar to that of the Pd coating layer.

A mold resin (an epoxy resin) as a package of a semiconductor device contains a silane coupling agent. The silane coupling agent has a function of improving adhesiveness between organic matter (resin) and inorganic matter (silicon or metal) and can thereby improve adhesiveness with a silicon substrate or metal. In a case where a higher adhesiveness is required such as a case of on-vehicle semiconductors that require reliability at higher temperatures, a "sulfur-containing silane coupling agent" is added therein. Sulfur contained in the mold resin is not liberated at about 130° C. as a temperature condition of HAST, but is liberated when being used under a condition of 175° C. or more, e.g., 175° C. to 200° C. When sulfur liberated at a high temperature of 175° C. or more comes in contact with Cu, Cu drastically corrodes to produce a sulfide ($Cu_2S$) or an oxide (CuO). When the corrosion of Cu occurs in a semiconductor device using Cu bonding wire, a bonding reliability, in particular of a ball bonded part, degrades.

As means for evaluating a bonding reliability of the ball bonded part in a high-temperature environment at 170° C. or more, there is used a high temperature storage test (HTS) (a high-temperature shelf test). For a sample to be evaluated that has been exposed to a high-temperature environment, a bonding longevity of a ball bonded part is evaluated by measuring temporal changes in a resistance value of the ball bonded part, or measuring temporal changes in shear strength of the ball bonded part. For on-vehicle semiconductor devices, it is required an improvement in the bonding reliability of the ball bonded part in HTS of 175° C. to 200° C.

It is preferable that the bonding wire of the present invention further contains at least one or more elements selected from Ni, Zn, Rh, In, Ir, Pt, Ga and Ge and a concentration of each of the elements is 0.011 to 1.2% by mass relative to the entire wire. When the bonding wire of the present invention further contains these elements, it is able to improve performance in HTS at 175° C. or more among the bonding reliability of the ball bonded part in a high temperature environment. In view of improving the bonding reliability of a ball bonded part in a high-temperature environment (especially the performance in HTS at 175° C. or more), a concentration of each of the elements relative to the entire wire is preferably 0.011% by mass or more, more preferably 0.020% by mass or more, and further preferably 0.030% by mass or more, 0.050% by mass or more, 0.070% by mass or more, 0.090% by mass or more, 0.10% by mass or more, 0.15% by mass or more, or 0.20% by mass or more. In view of obtaining favorable FAB shape and in view of reducing the hardening of the bonding wire to reduce degradation of the wedge bondability, a concentration of each of the elements relative to the entire wire is preferably 1.2% by mass or less, and more preferably 1.1% by mass or less. When the bonding wire of the present invention contains a plurality of elements selected from Ni, Zn, Rh, In, Ir, Pt, Ga and Ge, a concentration of these elements in total is preferably 0.011 to 2.2% by mass relative to the entire wire. In view of improving the bonding reliability of a ball bonded part in a high-temperature environment (especially the performance in HTS at 175° C. or more), a concentration of the elements in total relative to the entire wire is preferably 0.011% by mass or more, more preferably 0.020% by mass or more, and further preferably 0.030% by mass or more, 0.050% by mass or more, 0.070% by mass or more, 0.090% by mass or more, 0.10% by mass or more, 0.15% by mass or more, or 0.20% by mass or more. In view of obtaining favorable FAB shape and in view of reducing the hardening of the bonding wire to reduce degradation of the wedge bondability, a concentration of the elements in total relative to the entire wire is preferably 2.0% by mass or less, 1.8% by mass or less, or 1.6% by mass or less.

In the bonding wire of the present invention, it is also preferable that the Cu alloy core material contains Pd and a concentration of Pd contained in the Cu alloy core material is 0.05 to 1.2% by mass. With this configuration, there can be obtained an effect similar to the case containing Ni, Zn, Rh, In, Ir, Pt, Ga and Ge. In the bonding wire of the present invention, in view of improving the bonding reliability of a ball bonded part in a high-temperature environment (especially the performance in HTS at 175° C. or more), a concentration of Pd contained in the Cu alloy core material is preferably 0.05% by mass or more, and more preferably 0.1% by mass or more, 0.2% by mass or more, 0.3% by mass or more, 0.4% by mass or more, or 0.5% by mass or more. In view of obtaining favorable FAB shape and in view of reducing the hardening of the bonding wire to reduce degradation of the wedge bondability, a concentration of Pd contained in the Cu alloy core material is preferably 1.2% by mass or less and more preferably 1.1% by mass or less. When the bonding wire of the present invention contains Ni, Zn, Rh, In, Ir, Pt, Ga, Ge and Pd in the amount of the range mentioned above, it can improve a loop formability, that is, it can reduce a leaning, which becomes a problem for high-density mounting. This is because a yield strength of a bonding wire increases and a deformation of the bonding wire can be reduced when the bonding wire contains these elements. Examples of a method for determining a concentration of Pd contained in the Cu alloy core material from a bonding wire product include a method that exposes a cross-section of a bonding wire and performs a concentration analysis of a region of the Cu alloy core material, and a method that performs a concentration analysis of a region of the Cu alloy core material while trimming the bonding wire from its surface in a depth direction by sputtering or the like. When the Cu alloy core material contains a region having a concentration gradient of Pd, for example, line analysis may be performed on a cross-section of the bonding wire, and a concentration analysis may be performed on a region that has no concentration gradient of Pd (a region in which a degree of a change in Pd concentration in the depth direction is less than 10 mol % per 0.1 µm, for example). A method of concentration analysis will be described below.

By containing Ni, Zn, Rh, In, Ir, Pt, Ga, Ge and Pd in the amount of the range mentioned above, the bonding wire of the present invention can further improve the bonding longevity of a ball bonded part in a high-temperature and high-humidity environment of a temperature of 130° C. and a relative humidity of 85%. It is considered that when the bonding wire of the present invention further contains Ni, Zn, Rh, In, Ir, Pt, Ga, Ge and Pd in a certain amount, the formation of $Cu_9Al_4$ intermetallic compound in a bonded part tends to be further reduced. When these elements are further contained, the interfacial tension between Cu of the core material and Pd of the coating layer further decreases, and a concentration behavior of Pd in the ball bonded interface appears more remarkably. It can be thus estimated that an effect of reducing a mutual diffusion of Cu and Al by the Pd concentrated layer is further enhanced, and as a result of that, a formation amount of $Cu_9Al_4$, which is likely to corrode through the action of Cl, is remarkably reduced, and then the reliability of the ball bonded part in a high-temperature and high-humidity environment further improves.

It is preferable that the bonding wire of the present invention further contains at least one or more elements selected from B, P, Mg, Ca and La and a concentration of each of the elements is 1 to 100 ppm by mass relative to the entire wire. With this configuration, there can be improved a crushed shape of a ball bonded part required for high-density mounting, that is, there can be improved a circularity of shape of a ball bonded part. This is considered to be because an addition of the elements can allow a size of crystal grain in the ball to be fine and can reduce a deformation of the ball. In view of improving the crushed shape of a ball bonded part, that is, improving the circularity of shape of the ball bonded part, a concentration of each of the elements relative to the entire wire is preferably 1 ppm by mass or more and more preferably 2 ppm by mass or more, 3 ppm by mass or more, 4 ppm by mass or more, or 5 ppm by mass or more. In view of reducing the hardening of ball and reducing chip damage at the time of ball bonding, a concentration of each of the elements relative to the entire wire is preferably 100 ppm by mass or less and more preferably 95 ppm by mass or less, 90 ppm by mass or less, 85 ppm by mass or less, or 80 ppm by mass or less. When the bonding wire of the present invention contains a plurality of elements selected from B, P, Mg, Ca and La, a concentration of these elements in total is preferably 1 to 100 ppm by mass relative to the entire wire. In view of improving the crushed shape of a ball bonded part, that is, improving the circularity of shape of the ball bonded part, a concentration of the elements in total relative to the entire wire is preferably 1 ppm by mass or more, and more preferably 2 ppm by mass or more, 3 ppm by mass or more, 4 ppm by mass or more, or 5 ppm by mass or more. In view of reducing the hardening of ball and reducing chip damage at the time of ball bonding, a concentration of the elements in total relative to the entire wire is preferably 90 ppm by mass or less, 80 ppm by mass or less, or 70 ppm by mass or less.

For a concentration analysis of the Pd coating layer and the alloy skin layer containing Au and Pd and a concentration analysis of Pd in the Cu alloy core material, a method of performing analysis while trimming the bonding wire from its surface in the depth direction by sputtering or the like, or a method of exposing a cross-section of the wire and performing a line analysis, a point analysis, or the like thereon is effective. For an analyzer used for such concentration analysis, an Auger electron spectroscopic apparatus installed in a scanning electron microscope or a transmission electron microscope, an energy dispersive X-ray analyzer, and an electron probe micro analyzer, etc., can be applied. As a method for exposing a cross-section of wire, a mechanical polishing, an ion etching, etc., can be applied. For a microanalysis of As, Te, Sn, Sb, Bi, Se, Ni, Zn, Rh, In, Ir, Pt, Ga, Ge, B, P, Mg, Ca and La in the bonding wire, a solution obtained by dissolving the bonding wire with a strong acid is analyzed using an ICP emission spectrometer or an ICP mass spectrometer, thereby enabling detection as the concentrations of elements contained in the entire bonding wire.

In a preferable embodiment of the present invention, in a measurement result when measuring crystal orientations on a surface of the bonding wire, a crystal orientation <111> angled at 15 degrees or less to a longitudinal direction of the bonding wire has a proportion of 30 to 100% in terms of areal percentage. The embodiment can improve a loop formability, that is, improve a loop straightness required for high-density mounting and reduce variations in loop height. This is because when a surface crystal orientation is aligned, the bonding wire is resistant to lateral deformation and a lateral deformation thereof is reduced, and thus leaning failures can be reduced.

In view of reducing the leaning failures, the above mentioned crystal orientation <111> has a proportion of more preferably 35% or more, and further preferably 40% or more, 45% or more, 50% or more, or 55% or more in terms of areal percentage.

(Manufacturing Method)

Next, there will be described a method for manufacturing the bonding wire according to the embodiment of the present invention. The bonding wire is obtained by manufacturing a Cu alloy used for a core material, working it into a thin wire, forming a Pd coating layer and an Au layer, and performing heat treatment. After forming the Pd coating layer and the Au layer, another wire drawing and heat treatment may be performed. There will be described in detail a method for manufacturing the Cu alloy core material, a method for forming the Pd coating layer and an alloy skin layer containing Au and Pd, and a method of heat treatment.

The Cu core alloy used for a core material is obtained by melting Cu as a raw material and additive elements together and solidifying them. An arc heating furnace, a high-frequency heating furnace, a resistance heating furnace, or the like can be used for the melting. In order to prevent gases such as $O_2$ and $H_2$ being mixed therein from air, the melting is preferably performed in a vacuum atmosphere or an inert atmosphere such as Ar and $N_2$.

A method for forming the Pd coating layer and the Au layer on a surface of the Cu alloy core material includes a plating method, a vapor deposition method, and a melting method. For a plating method, both of an electroplating method and an electroless plating method can be used. The electroplating, called a strike plating or a flash plating, is high in plating speed and is favorable in adhesiveness with a substrate. A solution used for an electroless plating is classified into a substitutional type and a reduction type. Although performing the substitutional type plating alone is sufficient for a smaller thickness, it is effective for a larger thickness to perform the reduction type plating after the substitutional type plating in a step-by-step manner.

For a vapor deposition method, there can be used a physical adsorption such as a sputtering method, an ion plating method and a vacuum vapor deposition, and a chemical adsorption such as plasma CVD. They are all dry processes, and are free from the necessity of cleaning after forming the Pd coating layer and the Au layer and from any concern about surface contamination and the like during cleaning.

When heat treatment is performed after forming the Pd coating layer and the Au layer, Pd in the Pd coating layer diffuses into the Au layer to form the alloy skin layer containing Au and Pd. Instead of forming the alloy skin layer containing Au and Pd through the heat treatment after forming the Au layer, the alloy skin layer containing Au and Pd may be deposited from the beginning.

For a formation of the Pd coating layer and the alloy skin layer containing Au and Pd, both a method of forming them after performing wire drawing to a final diameter of wire and a method of forming them on a Cu alloy core material of large diameter and then performing wire drawing several times until obtaining a target diameter of wire are effective. In the former in which the Pd coating layer and the alloy skin layer containing Au and Pd are formed at the final diameter of wire, a manufacture, a quality control, and the like are simple. In the latter in which the wire drawing is performed in combination with the formed Pd coating layer and alloy skin layer containing Au and Pd, there is the advantage that adhesiveness with the Cu alloy core material improves. Specific examples of the respective formation methods include a method of forming the Pd coating layer and the alloy skin layer containing Au and Pd on a Cu alloy core material with a final diameter while successively sweeping the wire through an electroplating solution and a method of forming the Pd coating layer and the alloy skin layer containing by immersing a Cu alloy core material of large diameter into an electro or electroless plating solution and then drawing the wire to achieve a final diameter of wire.

After forming the Pd coating layer and the alloy skin layer containing Au and Pd, heat treatment may be carried out. By carrying out the heat treatment, diffusion of atoms occurs among the alloy skin layer containing Au and Pd, the Pd coating layer and the Cu alloy core material, which improves adhesive strength therebetween and is effective in that the alloy skin layer containing Au and Pd and the Pd coating layer are prevented from peeling during working, and thus, improving productivity. In order to prevent $O_2$ being mixed therein from air, it is preferable to perform the heat treatment in a vacuum atmosphere or an inert atmosphere such as Ar or $N_2$.

As described above, By adjusting a condition of diffusion heat treatment or annealing heat treatment performed on the bonding wire, Cu of the core material diffuses through the Pd coating layer and the skin alloy layer containing Au and Pd by grain boundary diffusion or the like, enabling Cu to reach an outermost surface of the bonding wire and allows Cu to be present at an outermost surface. For a heat treatment of allowing Cu to be present at an outermost surface, there can be used a heat treatment for forming the alloy skin layer containing Au and Pd as described above. When performing the heat treatment for forming the alloy skin layer, the temperature and time for heat treatment can be selected to allow Cu to be present at an outermost surface, or allow Cu to be not present at an outermost surface. Furthermore, it is also able to adjust a concentration of Cu at an outermost surface to a certain range, e.g., a range of 1 to 50 at %. Alternatively, Cu may be diffused to an outermost surface by heat treatment performed at other than the formation of the alloy skin layer.

As described above, as for addition of As, Te, Sn, Sb, Bi and Se into the bonding wire, the effect of the invention can be exhibited by either of the method of adding these elements into the Cu core material and the method of adding these elements therein by depositing these elements onto the Cu core material or the wire surface. The same shall apply for Ni, Zn, Rh, In, Ir, Pt, Ga, Ge, B, P, Mg, Ca and La.

The most simple method for adding the components is a method of adding them to starting materials of the Cu alloy core material. For example, high-purity copper and the above component element raw materials are weighed as starting raw materials and are then heated and melted in a high vacuum or in an inert atmosphere such as nitrogen and argon to produce an ingot in which the components have been added at the concentration of the intended range, thus obtaining the starting materials containing the component elements at the intended concentrations. Consequently, in a preferable embodiment, the Cu alloy core material of the bonding wire of the present invention contains at least one or more elements selected from As, Te, Sn, Sb, Bi and Se so that a concentration of the elements in total relative to the entire wire is 0.1 to 100 ppm by mass, and Sn≤10 ppm by mass; Sb≤10 ppm by mass; and Bi≤1 ppm by mass. The preferable numerical range of the total concentration is as described above. In another preferable embodiment, the Cu alloy core material of the bonding wire of the present invention contains at least one or more elements selected from Ni, Zn, Rh, In, Ir, Pt, Ga and Ge so that a concentration of each of the elements is 0.011 to 1.2% by mass relative to the entire wire. The preferable numerical range of the concentration is as described above. In a preferable embodiment, the purity of Cu of the Cu alloy core material is 3N or less (preferably 2N or less). In a conventional Pd-coated Cu bonding wire, in view of bondability, a Cu core material with high purity (4N or more) is used, and there is a tendency to avoid the use of a Cu core material with low purity. The bonding wire of the present invention containing the specific elements has achieved the bonding reliability of a ball bonded part in a high-temperature and high-humidity environment required for on-vehicle devices, especially preferably when using the Cu alloy core material of low Cu purity as described above. In another preferable embodiment, the Cu alloy core material of the bonding wire of the present invention contains at least one or more elements selected from B, P, Mg, Ca and La so that a concentration of each of the elements is 1 to 100 ppm by mass relative to the entire wire. The preferable numerical range of the concentration is as described above.

The above components can also be contained by depositing them on a surface of wire during a manufacturing process of wire. In this case, the deposition may be incorporated into any part of the manufacturing process of wire and may be repeated several times. The deposition may also be incorporated into a plurality of processes. The components may be added to a Cu surface before Pd coating, or may be added to a Pd surface after Pd coating, or may be added to an Au surface after Au coating, or may be incorporated into each coating process. A method of deposition can be selected from (1) application of an aqueous solution, followed by drying and heat treatment, (2) plating (wet), and (3) vapor deposition (dry).

When employing the method of application of an aqueous solution, followed by drying and heat treatment, first, an aqueous solution of an appropriate concentration is prepared with a water-soluble compound containing the component elements. The components can be thus incorporated into the wire material. The preparation may be incorporated into any part of the manufacturing process of wire and may be repeated several times. The preparation may be incorporated into a plurality of processes. It may be added to a Cu surface before Pd coating, or may be added to a Pd surface after Pd coating, or may be added to an Au surface after Au coating, or may be incorporated into each coating process.

When using plating (wet), plating can be either of electroplating and electroless plating. In electroplating, plating called flash plating, which is high in plating speed and favorable in adhesiveness with a substrate, can also be used in addition to normal electroplating. A solution used for electroless plating is classified into a substitutional type and a reduction type. Although the substitutional type plating is generally used for a smaller thickness and the reduction type plating is used for a larger thickness, either of them can be used. They may be selected depending on a concentration desired to be added, and a plating solution concentration and a time may be adjusted. Both electroplating and electroless plating may be incorporated into any part of the manufacturing process of wire and may be repeated several times. Both electroplating and electroless plating may be incorporated into a plurality of processes. They may be added to a Cu surface before Pd coating, or may be added to a Pd surface after Pd coating, or may be added to an Au surface after Au coating, or may be incorporated into each coating process.

The vapor deposition (dry) includes sputtering, ion plating, vacuum deposition, plasma CVD, and the like. It has advantages in that it is dry process and eliminates pretreatment and posttreatment, giving no concern about contamination. Although vapor deposition generally has a problem that an addition speed of a target element is slow, it is one of appropriate methods in light of the object of the present invention because an addition amount of the above component elements is relatively low.

The vapor deposition may be incorporated into any part of the manufacturing process of wire or may be repeated several times. The vapor deposition may be incorporated into a plurality of processes. It may be added to a Cu surface before Pd coating, or may be added to a Pd surface after Pd coating, or may be added to an Au surface after Au coating, or may be incorporated into each coating processes.

The proportion of the crystal orientation <111> angled at 15 degrees or less to a longitudinal direction of the bonding wire, when measuring crystal orientations on a surface of the bonding wire, can be set to a range of 30 to 100% according to the following method. That is, a working rate after forming the Pd coating layer or after forming the Pd coating layer and the Au skin layer is made large, which allows texture having directivity on a surface of the wire (texture having a crystal orientation aligned to a wire drawing direction) to be developed. Specifically, a working rate after forming the Pd coating layer or after forming the Pd coating layer and the Au skin layer is set to be 90% or more, which allows the proportion of the crystal orientation <111> angled at 15 degrees or less to a longitudinal direction of the bonding wire, when measuring crystal orientations on a surface of the bonding wire, to be 30% or more in terms of areal percentage. The working rate is represented by "working rate (%)=(cross-sectional area of wire before working −cross-sectional area of wire after working)/cross-sectional area of wire before working×100."

When measuring crystal orientations on a surface of wire, electron backscattered diffraction (EBSD) method is preferably used. The EBSD method can be used to observe crystal orientations on an observation surface and graphically shows an angle difference of the crystal orientations between adjacent measurement points. Further, the EBSD method can be used to relatively easily observe the crystal orientations with high accuracy, even for a thin wire like the bonding wire.

The present invention is not limited to the above embodiment, and appropriate alterations can be made within the scope of the spirit of the present invention.

EXAMPLES

The bonding wire according to an embodiment of the present invention will be described in detail below with reference to examples.

(Sample)

First, there will be described a method for manufacturing a sample. For Cu as a raw material of a core material, Cu with a purity of 99.99% by mass or more and containing inevitable impurities as the remainder was used. For As, Te, Sn, Sb, Bi, Se, Ni, Zn, Rh, In, Ir, Pt, Ga, Ge, Pd, B, P, Mg, Ca and La, the ones with a purity of 99% by mass or more and containing inevitable impurities as the remainder were used. As, Te, Sn, Sb, Bi, Se, Ni, Zn, Rh, In, Ir, Pt, Ga, Ge, Pd, B, P, Mg, Ca and La as additive elements to the core material are mixed so that the wire or the core material will have a desired composition. Regarding the addition of As, Te, Sn, Sb, Bi, Se, Ni, Zn, Rh, In, Ir, Pt, Ga, Ge, Pd, B, P, Mg, Ca and La, they can be mixed singly. Alternatively, they may be mixed so as to be a desired amount using a Cu master alloy containing the additive elements manufactured in advance if the element has a high melting point as a single body or if the element is added in an infinitesimal amount.

The Cu alloy for the core material was manufactured by charging the raw materials into a carbon crucible worked into a cylindrical shape with a diameter of 3 to 6 mm, heating and melting the raw materials at 1,090 to 1,300° C. in vacuum or in an inert atmosphere such as an $N_2$ or Ar gas using a high-frequency furnace, and performing furnace cooling. The obtained alloy with a diameter of 3 to 6 mm was drawn to manufacture a wire with a diameter of 0.9 to 1.2 mm. Thereafter, a wire with a diameter of 300 to 600 μm was manufactured by successively performing wire drawing and the like using a die. A commercially available lubricant was used for the wire drawing, and a wire drawing speed was 20 to 150 m/min. In order to remove an oxide film on a surface of wire, a pickling treatment with hydrochloric acid was performed, and a Pd coating layer was formed by 1 to 15 µm so as to cover the entire surface of the Cu alloy as the core material. Furthermore, for some wires, an alloy skin layer containing Au and Pd was formed by 0.05 to 1.5 µm on the Pd coating layer. For the formation of the Pd coating layer and the alloy skin layer containing Au and Pd, electroplating was used. A commercially available semiconductor plating solution was used for a plating solution. Heat treatment at 200 to 500° C. and wire drawing were then repeatedly carried out to perform working to a diameter of 20 µm. After working, heat treatment was performed while flowing an $N_2$ or Ar gas so that breaking elongation will finally be about 5 to 15%. A method of heat treatment was performed while successively sweeping the wire and was carried out while flowing an $N_2$ or Ar gas. A wire feeding speed was 20 to 200 m/min, a heat treatment temperature was 200 to 600° C., and a heat treatment time was 0.2 to 1.0 second.

By adjusting the working rate after forming the Pd coating layer or after forming the Pd coating layer and the alloy skin layer containing Au and Pd, the proportion (areal percentage) of the crystal orientation <111> angled at 15 degrees or less to a longitudinal direction of the bonding wire, when measuring crystal orientations on a surface of the bonding wire, was adjusted.

For a concentration analysis of the Pd coating layer and the alloy skin layer containing Au and Pd, an Auger electron spectrometry was performed while trimming the bonding wire from its surface in the depth direction by sputtering or the like. From an obtained concentration profile in the depth direction, there were determined a thickness of the Pd coating layer and a thickness of the alloy skin layer containing Au and Pd.

Concerning Working Examples 93 through 98 listed in Table 1-5, Cu with a purity of 99.99% by mass or more was used for the core material, and As, Te, Sn, Sb, Bi and Se were contained by depositing them onto the wire surface by electroplating during a manufacturing process of wire. In this regard, a column of "method for adding components" was provided in Table 1-5, and "coating layer" was entered for Working Examples 99 through 109. Concerning all of Table 1-1 through Table 1-4 and examples for which "core material" was entered in the column "method for adding components" in Table 1-5, As, Te, Sn, Sb, Bi and Se were contained in the core material.

Concerning Working Examples 99 through 109 and Comparative Examples 13 and 14 listed in Table 1-5, Cu is caused to be present at an outermost surface of the bonding wire. In this regard, a column of "Cu concentration at wire surface" is provided in Table 1-5, and results obtained by measuring a surface of the bonding wire by an Auger electron spectroscopic apparatus were entered therein. By selecting a temperature and time for heat treatment of the bonding wire, Cu was caused to be present at an outermost surface at a certain concentration. Concerning all of Table 1-1 through Table 1-4 and examples for which the column "Cu concentration at wire surface" is blank in Table 1-5, heat treatment conditions that caused Cu not to be present at an outermost surface were applied, and therefore Cu was not detected by the Auger electron spectroscopic apparatus.

The configurations of the samples manufactured according to the above procedure are listed in Table 1-1 through Table 1-5.

TABLE 1

| Test | | In wire (% by mass) (In core material for Pd (% by mass)) | | | | | | | | | | | | | | In wire (ppm by mass) | | |
|---|---|---|---|---|---|---|---|---|---|---|---|---|---|---|---|---|---|---|
| | No. | As | Te | Sn | Sb | Bi | Se | Ni | Zn | Rh | In | Ir | Pt | Pd | Ga | Ge | B | P | Mg |
| Working Example | 1 | 0.4 | | | | | | | | | | | | | | | | | |
| | 2 | 1.2 | | | | | | | | | | | | | | | | | |
| | 3 | 12 | | | | | | | | | | | | | | | | | |
| | 4 | 75 | | | | | | | | | | | | | | | | | |
| | 5 | | 0.1 | | | | | | | | | | | | | | | | |
| | 6 | | 1.2 | | | | | | | | | | | | | | | | |
| | 7 | | 15 | | | | | | | | | | | | | | | | |
| | 8 | | 98 | | | | | | | | | | | | | | | | |
| | 9 | | | 0.2 | | | | | | | | | | | | | | | |
| | 10 | | | 1.3 | | | | | | | | | | | | | | | |
| | 11 | | | 10 | | | | | | | | | | | | | | | |
| | 12 | | | | 0.1 | | | | | | | | | | | | | | |
| | 13 | | | | 1.2 | | | | | | | | | | | | | | |
| | 14 | | | | 9.8 | | | | | | | | | | | | | | |
| | 15 | | | | | 0.3 | | | | | | | | | | | | | |
| | 16 | | | | | 1 | | | | | | | | | | | | | |
| | 17 | | | | | | 0.1 | | | | | | | | | | | | |
| | 18 | | | | | | 1.2 | | | | | | | | | | | | |
| | 19 | | | | | | 4.9 | | | | | | | | | | | | |
| | 20 | | | | | | 99 | | | | | | | | | | | | |
| Working Example | 21 | | | 0.5 | | 10 | | | | | | | | | | | | | |
| | 22 | | 0.7 | | 0.9 | | | | | | | | | | | | | | |
| | 23 | 0.3 | | 0.2 | | | | | | | | | | | | | | | |
| | 24 | | 7.2 | | | | 3.5 | | | | | | | | | | | | |
| | 25 | | | | | 0.3 | 0.4 | | | | | | | | | | | | |
| | 26 | 21 | | 8.1 | | | | | | | | | | | | | | | |
| Working Example | 27 | 0.3 | | | | | | 0.05 | | | | | | | | | | | |
| | 28 | 1.1 | | | | | | | | | 0.7 | | | | | | | 1 | |
| | 29 | 2.5 | | | | | | | | | | | | | 0.011 | | | | |
| | 30 | 18 | | | | | | | | | | | 1.2 | | | | | | |
| | 31 | 31 | | | | | | | | | | | | | | 1.2 | | | 1 |
| | 32 | 50 | | | | | | | 0.1 | | | | | | | | | | |
| | 33 | 86 | | | | | | | | | | | 0.05 | | | | | | |
| | 34 | | 0.1 | | | | | | | | | | | 0.05 | | | | | |

TABLE 1-continued

|  | Test No. | C1 | C2 | C3 | C4 | C5 | C6 | C7 | C8 | C9 | C10 | C11 |
|---|---|---|---|---|---|---|---|---|---|---|---|---|
|  | 35 | 4.1 |  |  |  |  |  | 1.2 |  | 100 |  |  |
|  | 36 | 8.1 |  |  |  |  |  | 0.7 |  |  | 100 |  |
|  | 37 | 12 |  |  |  |  |  |  | 0.7 |  |  | 50 |
|  | 38 | 18 |  |  | 0.7 |  |  |  |  |  | 50 |  |
|  | 39 | 52 |  |  |  |  | 0.05 |  |  |  |  |  |
|  | 40 | 99 |  |  |  | 0.1 |  |  |  |  |  |  |
|  | 41 |  | 0.2 |  |  | 0.011 |  |  |  |  |  | 1 |
|  | 42 |  | 1.2 |  | 0.05 |  |  |  |  |  |  |  |
|  | 43 |  | 6.5 |  |  | 0.1 |  |  |  |  |  |  |
|  | 44 |  | 10 |  |  |  | 0.7 |  | 1 |  |  |  |
|  | 45 |  |  | 0.1 |  |  | 0.05 |  |  |  |  |  |
|  | 46 |  |  | 0.5 |  |  |  | 0.05 |  |  |  |  |
|  | 47 |  |  | 1.2 | 0.1 |  |  |  |  |  |  | 100 |
|  | 48 |  |  | 5.2 |  | 0.7 |  |  |  |  | 1 |  |
|  | 49 |  |  | 6.3 |  |  |  |  | 0.011 |  |  |  |
|  | 50 |  |  | 9.9 |  |  | 0.7 |  |  |  |  |  |
|  | 51 |  |  |  | 0.1 |  |  | 1.2 |  |  |  |  |
|  | 52 |  |  |  | 0.2 |  | 0.05 |  |  |  |  |  |
|  | 53 |  |  |  | 0.5 | 0.1 |  |  |  |  |  | 100 |
|  | 54 |  |  |  | 0.8 |  |  | 0.7 | 50 |  |  |  |
|  | 55 |  |  |  | 1 | 0.011 |  |  |  |  |  |  |
|  | 56 |  |  |  |  | 0.1 | 0.05 |  |  |  |  |  |
|  | 57 |  |  |  |  | 5.6 |  | 0.7 |  |  | 50 |  |
|  | 58 |  |  |  |  | 7.8 |  |  | 0.1 |  | 50 |  |
|  | 59 |  |  |  |  | 11 |  | 0.011 |  |  | 50 |  |
|  | 60 |  |  |  |  | 20 |  |  | 0.1 |  |  | 1 |
|  | 61 |  |  |  |  | 51 |  |  | 0.1 |  |  | 1 |
|  | 62 |  |  |  |  | 98 | 0.7 |  |  |  |  |  |
| Working Example | 63 | 0.2 |  |  |  |  | 0.1 |  | 0.1 |  |  |  |
|  | 64 | 6.2 |  |  |  |  |  | 0.7 | 0.1 |  | 1 |  |
|  | 65 | 10 |  |  |  |  | 0.05 |  | 1.1 |  |  |  |
|  | 66 | 20 |  |  |  | 0.1 |  | 1.1 |  |  |  |  |
|  | 67 | 51 |  |  |  |  | 0.7 |  |  | 0.1 | 1 |  |
|  | 68 | 90 |  |  |  |  | 0.1 | 0.05 |  |  |  |  |
|  | 69 |  | 0.2 |  |  |  |  | 0.05 | 0.1 |  |  |  |
|  | 70 |  | 2.5 |  |  | 1.1 |  |  |  | 0.05 | 100 |  |
|  | 71 |  | 5.2 |  |  |  |  | 0.1 | 1.1 |  | 100 |  |
|  | 72 |  | 21 |  |  | 0.7 | 0.1 |  |  |  |  | 50 |
|  | 73 |  | 41 |  |  |  |  |  | 1.1 | 0.05 |  | 1 |
|  | 74 |  | 98 |  |  | 0.1 |  |  | 0.1 |  |  |  |
|  | 75 |  |  | 0.1 |  |  | 0.7 | 0.7 |  |  | 50 |  |
|  | 76 |  |  | 2.5 |  |  | 0.05 |  | 1.2 |  | 100 |  |
|  | 77 |  |  | 10 |  | 0.05 |  |  | 1.2 |  |  | 1 |
|  | 78 |  |  |  | 0.2 |  | 1.1 | 1.1 |  |  |  |  |
|  | 79 |  |  |  | 0.6 |  |  |  | 0.05 | 0.1 |  |  |
|  | 80 |  |  |  | 2.2 |  |  | 0.7 | 0.05 |  |  |  |
|  | 81 |  |  |  | 5.5 |  |  |  | 0.1 | 0.7 |  |  |
|  | 82 |  |  |  | 9.8 |  |  | 0.05 |  | 0.7 |  |  |
|  | 83 |  |  |  |  | 0.1 | 0.1 |  |  | 1.1 |  |  |
|  | 84 |  |  |  |  | 0.3 | 0.7 | 0.05 |  |  |  |  |
|  | 85 |  |  |  |  | 0.8 | 0.05 |  |  |  | 0.05 | 100 |
|  | 86 |  |  |  |  | 0.9 | 0.7 |  |  | 0.7 |  | 100 |
|  | 87 |  |  |  |  |  | 0.1 |  | 0.1 | 1.1 |  |  |
|  | 88 |  |  |  |  |  | 6.8 | 0.1 |  | 0.1 |  | 50 |
|  | 89 |  |  |  |  |  | 8.0 |  | 0.7 |  | 0.05 | 1 |
|  | 90 |  |  |  |  |  | 11 | 1.1 |  |  | 0.05 | 50 |
|  | 91 |  |  |  |  |  | 40 |  |  | 0.1 | 1.1 | 50 |
|  | 92 |  |  |  |  |  | 95 | 0.1 |  | 0.7 |  |  |

|  |  | In wire (ppm by mass) | | Film thickness of Pd coating layer (μm) | Film thickness of alloy skin layer containing Au and Pd (μm) | Surface crystal orientation <111> (%) | Quality evaluation results | | | | | |
|---|---|---|---|---|---|---|---|---|---|---|---|---|
|  | Test No. | Ca | La |  |  |  | HAST | HTS | FAB shape | Wedge bondability | Crushed shape | Leaning |
| Working Example | 1 |  |  | 0.1 | 0.01 | 91 | ○ | Δ | ⊚ | ⊚ | ○ | ⊚ |
|  | 2 |  |  | 0.15 | 0.05 | 33 | ⊚ | Δ | ○ | ⊚ | ○ | ○ |
|  | 3 |  |  | 0.01 | — | 57 | ⊚ | Δ | Δ | ○ | Δ | ⊚ |
|  | 4 |  |  | 0.05 | 0.001 | 96 | ⊚ | Δ | ⊚ | ⊚ | ○ | ⊚ |
|  | 5 |  |  | 0.015 | 0.0005 | 97 | ○ | Δ | ⊚ | ○ | ○ | ⊚ |
|  | 6 |  |  | 0.1 | 0.001 | 33 | ⊚ | Δ | ⊚ | ⊚ | ○ | ○ |
|  | 7 |  |  | 0.15 | 0.003 | 59 | ⊚ | Δ | ○ | ⊚ | ○ | ⊚ |
|  | 8 |  |  | 0.01 | 0.01 | 89 | ⊚ | Δ | Δ | ⊚ | ○ | ⊚ |
|  | 9 |  |  | 0.015 | 0.05 | 38 | ○ | Δ | ○ | ⊚ | ○ | ○ |
|  | 10 |  |  | 0.05 | — | 58 | ⊚ | Δ | ⊚ | Δ | ○ | ⊚ |
|  | 11 |  |  | 0.1 | 0.0005 | 98 | ⊚ | Δ | ⊚ | ○ | ○ | ⊚ |

TABLE 1-continued

| | | | | | | | | | | | | |
|---|---|---|---|---|---|---|---|---|---|---|---|---|
| | 12 | | | 0.15 | 0.001 | 30 | ◯ | △ | ◯ | ◎ | ◯ | ◯ |
| | 13 | | | 0.015 | 0.003 | 61 | ◎ | △ | ◯ | ◎ | ◯ | ◎ |
| | 14 | | | 0.05 | 0.01 | 99 | ◎ | △ | ◎ | ◎ | ◯ | ◎ |
| | 15 | | | 0.1 | 0.05 | 32 | ◯ | △ | ◎ | ◎ | ◯ | ◎ |
| | 16 | | | 0.15 | 0.001 | 59 | ◎ | △ | ◯ | ◎ | ◯ | ◎ |
| | 17 | | | 0.015 | 0.003 | 90 | ◯ | △ | ◯ | ◎ | ◯ | ◎ |
| | 18 | | | 0.05 | 0.01 | 30 | ◎ | △ | ◎ | ◎ | ◯ | ◯ |
| | 19 | | | 0.1 | 0.05 | 62 | ◎ | △ | ◎ | ◎ | ◯ | ◎ |
| | 20 | | | 0.15 | — | 95 | ◎ | △ | ◯ | △ | ◯ | ◎ |
| Working | 21 | | | 0.1 | 0.003 | 90 | ◎ | △ | ◎ | ◎ | ◯ | ◎ |
| Example | 22 | | | 0.15 | 0.01 | 30 | ◎ | △ | ◯ | ◎ | ◯ | ◯ |
| | 23 | | | 0.05 | 0.05 | 61 | ◯ | △ | ◎ | ◎ | ◯ | ◎ |
| | 24 | | | 0.01 | 0.003 | 58 | ◎ | △ | △ | ◎ | ◯ | ◎ |
| | 25 | | | 0.1 | 0.01 | 93 | ◯ | △ | ◎ | ◎ | ◯ | ◎ |
| | 26 | | | 0.05 | 0.001 | 98 | ◎ | △ | ◎ | ◎ | ◯ | ◎ |
| Working | 27 | | | 0.1 | 0.01 | 32 | ◎ | ◯ | ◎ | ◎ | ◯ | ◎ |
| Example | 28 | | | 0.15 | 0.05 | 58 | ◎ | ◎ | ◎ | ◎ | ◯ | ◎ |
| | 29 | | | 0.01 | — | 65 | ◎ | ◎ | △ | △ | ◯ | ◎ |
| | 30 | | | 0.01 | 0.0005 | 88 | ◎ | ◎ | △ | ◯ | ◯ | ◎ |
| | 31 | | | 0.015 | 0.001 | 88 | ◎ | ◎ | ◯ | ◎ | ◎ | ◎ |
| | 32 | 1 | | 0.15 | 0.003 | 66 | ◎ | ◎ | ◯ | ◎ | ◯ | ◎ |
| | 33 | | 100 | 0.05 | 0.001 | 31 | ◎ | ◎ | ◎ | ◎ | ◯ | ◎ |
| | 34 | | | 0.015 | — | 30 | ◎ | ◎ | ◯ | △ | ◯ | ◎ |
| | 35 | | | 0.1 | 0.001 | 62 | ◎ | ◎ | ◎ | ◎ | ◯ | ◎ |
| | 36 | | | 0.1 | 0.003 | 30 | ◎ | ◎ | ◎ | ◎ | ◯ | ◎ |
| | 37 | | | 0.05 | 0.05 | 99 | ◎ | ◎ | ◯ | ◎ | ◯ | ◎ |
| | 38 | | | 0.15 | 0.003 | 90 | ◎ | ◎ | ◯ | ◎ | ◯ | ◎ |
| | 39 | | 50 | 0.1 | 0.0005 | 54 | ◎ | ◎ | ◎ | ◯ | ◎ | ◎ |
| | 40 | | | 0.01 | 0.01 | 33 | ◎ | ◎ | △ | ◎ | ◯ | ◎ |
| | 41 | | | 0.015 | — | 60 | ◎ | ◎ | ◯ | △ | ◎ | ◎ |
| | 42 | 50 | | 0.05 | 0.0005 | 89 | ◎ | ◎ | ◎ | ◯ | ◎ | ◎ |
| | 43 | | | 0.1 | 0.001 | 30 | ◎ | ◎ | ◎ | ◎ | ◯ | ◎ |
| | 44 | | | 0.15 | 0.003 | 62 | ◎ | ◎ | ◯ | ◎ | ◎ | ◎ |
| | 45 | 50 | | 0.01 | 0.01 | 95 | ◎ | ◎ | △ | ◎ | ◎ | ◎ |
| | 46 | 100 | | 0.15 | 0.01 | 59 | ◎ | ◎ | ◯ | ◎ | ◎ | ◎ |
| | 47 | | | 0.015 | 0.05 | 35 | ◎ | ◎ | ◯ | ◎ | ◎ | ◎ |
| | 48 | | | 0.05 | — | 65 | ◎ | ◎ | ◎ | △ | ◎ | ◎ |
| | 49 | | 1 | 0.05 | 0.05 | 94 | ◎ | ◎ | ◎ | ◎ | ◎ | ◎ |
| | 50 | | 50 | 0.1 | 0.0005 | 95 | ◎ | ◎ | ◎ | ◯ | ◎ | ◎ |
| | 51 | | | 0.1 | 0.0005 | 29 | ◎ | ◎ | ◎ | ◯ | ◯ | ◎ |
| | 52 | | | 0.15 | 0.001 | 30 | ◎ | ◎ | ◯ | ◯ | ◯ | ◎ |
| | 53 | | | 0.01 | 0.003 | 59 | ◎ | ◎ | △ | ◎ | ◯ | ◎ |
| | 54 | | | 0.15 | 0.001 | 62 | ◎ | ◎ | ◯ | ◎ | ◯ | ◎ |
| | 55 | | | 0.015 | 0.01 | 97 | ◎ | ◎ | ◯ | ◎ | ◯ | ◎ |
| | 56 | | 1 | 0.05 | 0.05 | 32 | ◎ | ◎ | ◎ | ◎ | ◎ | ◎ |
| | 57 | | | 0.1 | — | 61 | ◎ | ◎ | ◎ | △ | ◎ | ◎ |
| | 58 | | | 0.1 | 0.01 | 30 | ◎ | ◎ | ◎ | ◎ | ◎ | ◎ |
| | 59 | | | 0.15 | 0.0005 | 96 | ◎ | ◎ | ◯ | ◯ | ◎ | ◎ |
| | 60 | | | 0.01 | 0.003 | 90 | ◎ | ◎ | △ | ◎ | ◎ | ◎ |
| | 61 | | | 0.01 | 0.001 | 33 | ◎ | ◎ | △ | ◎ | ◎ | ◎ |
| | 62 | 1 | | 0.015 | 0.003 | 62 | ◎ | ◎ | ◯ | ◎ | ◎ | ◎ |
| Working | 63 | | | 0.1 | 0.1 | 65 | ◎ | ◎ | ◎ | ◎ | ◯ | ◎ |
| Example | 64 | | | 0.15 | 0.05 | 91 | ◎ | ◎ | ◯ | ◎ | ◎ | ◎ |
| | 65 | | | 0.01 | — | 64 | ◎ | ◎ | △ | △ | ◯ | ◎ |
| | 66 | | | 0.01 | — | 31 | ◎ | ◎ | △ | △ | ◯ | ◎ |
| | 67 | | | 0.015 | 0.001 | 87 | ◎ | ◎ | ◯ | ◎ | ◎ | ◎ |
| | 68 | | 100 | 0.05 | 0.001 | 59 | ◎ | ◎ | ◎ | ◎ | ◎ | ◎ |
| | 69 | | | 0.05 | 0.0005 | 60 | ◎ | ◎ | ◎ | ◎ | ◯ | ◯ |
| | 70 | | | 0.1 | 0.003 | 29 | ◎ | ◎ | ◎ | ◎ | ◎ | ◎ |
| | 71 | | | 0.1 | 0.001 | 92 | ◎ | ◎ | ◎ | ◎ | ◎ | ◎ |
| | 72 | | | 0.15 | 0.003 | 31 | ◎ | ◎ | ◯ | ◎ | ◎ | ◎ |
| | 73 | | | 0.05 | 0.05 | 98 | ◎ | ◎ | ◎ | ◎ | ◎ | ◎ |
| | 74 | | | 0.01 | 0.01 | 58 | ◎ | ◎ | △ | ◎ | ◯ | ◎ |
| | 75 | | | 0.05 | — | 96 | ◎ | ◎ | ◎ | △ | ◎ | ◎ |
| | 76 | | | 0.1 | 0.0005 | 32 | ◎ | ◎ | ◎ | ◯ | ◎ | ◎ |
| | 77 | | | 0.15 | 0.001 | 63 | ◎ | ◎ | ◯ | ◎ | ◎ | ◎ |
| | 78 | 50 | | 0.01 | 0.003 | 91 | ◎ | ◎ | △ | ◎ | ◎ | ◎ |
| | 79 | 100 | | 0.15 | 0.01 | 58 | ◎ | ◎ | ◯ | ◎ | ◎ | ◎ |
| | 80 | | 50 | 0.05 | 0.01 | 35 | ◎ | ◎ | ◎ | ◎ | ◎ | ◎ |
| | 81 | | 100 | 0.05 | 0.05 | 95 | ◎ | ◎ | ◎ | ◎ | ◎ | ◎ |
| | 82 | | | 0.1 | 0.05 | 64 | ◎ | ◎ | ◎ | ◎ | ◯ | ◎ |
| | 83 | | | 0.1 | 0.0005 | 30 | ◎ | ◎ | ◎ | ◯ | ◯ | ◎ |
| | 84 | 1 | | 0.15 | — | 94 | ◎ | ◎ | ◯ | △ | ◎ | ◎ |
| | 85 | | | 0.15 | 0.001 | 63 | ◎ | ◎ | ◯ | ◯ | ◎ | ◎ |
| | 86 | | | 0.01 | 0.0005 | 32 | ◎ | ◎ | △ | ◯ | ◎ | ◎ |
| | 87 | | | 0.05 | 0.001 | 59 | ◎ | ◎ | ◎ | ◎ | ◯ | ◎ |
| | 88 | | | 0.1 | 0.003 | 98 | ◎ | ◎ | ◎ | ◎ | ◎ | ◎ |
| | 89 | | | 0.1 | 0.01 | 31 | ◎ | ◎ | ◎ | ◎ | ◎ | ◎ |
| | 90 | | | 0.15 | 0.01 | 31 | ◎ | ◎ | ◯ | ◎ | ◎ | ◎ |

TABLE 1-continued

| | | | | | | | |
|---|---|---|---|---|---|---|---|
| 91 | | 0.01 | 0.003 | 91 | ◎ ◎ Δ | ◎ ◎ | ◎ |
| 92 | 50 | 0.01 | 0.06 | 62 | ◎ ◎ Δ | ◎ ◎ | ◎ |

| | | In wire (% by mass) (In core material for Pd (% by mass)) | | | | | | | | | | | | | In wire (ppm by mass) | | | | |
|---|---|---|---|---|---|---|---|---|---|---|---|---|---|---|---|---|---|---|---|
| Test No. | As | Te | Sn | Sb | Bi | Se | Ni | Zn | Rh | In | Ir | Pt | Pd | Ga | Ge | B | P | Mg | Ca | La |
| Working Example 93 | 20 | | | | | | | | | | | | | | | | | | | |
| 94 | | 14 | | | | | | | | | | | | | | | | | | |
| 95 | | | 3.2 | | | | | | | | | | | | | | | | | |
| 96 | | | | 5.2 | | | | | | | | | | | | | | | | |
| 97 | | | | | 0.5 | | | | | | | | | | | | | | | |
| 98 | | | | | | 4.5 | | | | | | | | | | | | | | |
| 99 | 22 | | | | | | | | | | 0.1 | | 1.1 | | | | | | | |
| 100 | | 16 | | | | | | | | | | | | | | | | | | |
| 101 | | | 4.1 | | | | | | | | | | | | | | | | | |
| 102 | | | | 5.8 | | | 0.7 | | | | | 0.7 | | | | | | | | |
| 103 | | | | | 0.7 | | | | | | | | | | | | | | | |
| 104 | | | | | | 4.8 | | 1.1 | 1.1 | | | | | | | | | | | |
| 105 | 2.5 | | | | | | | 0.7 | | | | | | 0.1 | | | | | | |
| 106 | | 1.8 | | | | | | | 0.1 | | | | | | 0.05 | | | | | |
| 107 | | | | 0.5 | | | 1.1 | | | | | | | 0.05 | | | | | | |
| 108 | | | | | 0.2 | | | | | | 0.05 | | | | 0.1 | | | | | |
| 109 | | | | | | 20 | | | | | | | 0.7 | 0.02 | | | | | | |
| Comparative Example 1 | — | — | — | — | — | — | | | | | | | | | | | | | | |
| 2 | 0.06 | | | | | | | | | | | | | | | | | | | |
| 3 | | 156 | | | | | | | | | | | | | | | | | | |
| 4 | | | 0.07 | | | | | | | | | | | | | | | | | |
| 5 | | | | 0.05 | | | | | | | | | | | | | | | | |
| 6 | | | | | 0.03 | | | | | | | | | | | | | | | |
| 7 | | | | | | 135 | | | | | | | | | | | | | | |
| 8 | | 11 | | | | | | | | | | | | | | | | | | |
| 9 | | | | 11 | | | | | | | | | | | | | | | | |
| 10 | | | | | 1.2 | | | | | | | | | | | | | | | |
| 11 | — | — | — | — | — | — | | | | | | | | | | | | | | |
| 12 | — | — | — | — | — | — | | | | | | | | | | | | | | |
| 13 | — | — | — | — | — | — | | | | | | | | | | | | | | |
| 14 | — | — | — | — | — | — | | | | | | | | | | | | | | |

| | | | Wire characteristics | | | | | | | | |
|---|---|---|---|---|---|---|---|---|---|---|---|
| Test No. | Method for adding components | Film thickness of Pd coating layer (μm) | Film thickness of alloy skin layer containing Au and Pd (μm) | Surface crystal orientation <111> (%) | Cu concentration at wire surface (at %) | HAST | HTS | FAB shape | Wedge bondability | Crushed shape | Leaning |
| Working Example 93 | Coating layer | 0.1 | 0.001 | 91 | | ◎ | Δ | ◎ | ◎ | ○ | ◎ |
| 94 | | 0.15 | 0.003 | 32 | | ◎ | Δ | ○ | ◎ | ○ | ○ |
| 95 | | 0.01 | 0.01 | 63 | | ◎ | Δ | Δ | ◎ | ○ | ◎ |
| 96 | | 0.05 | 0.05 | 92 | | ◎ | Δ | ◎ | ◎ | ○ | ◎ |
| 97 | | 0.1 | — | 34 | | ○ | Δ | ◎ | Δ | ○ | ○ |
| 98 | | 0.15 | 0.0005 | 65 | | ◎ | Δ | ○ | ○ | ○ | ◎ |
| 99 | Core material | 0.1 | 0.001 | 72 | 5.4 | ◎◎ | Δ | ○ | ○ | ○ | ◎ |
| 100 | | 0.15 | 0.003 | 30 | 5.2 | ◎◎ | ◎ | ○ | ○ | ○ | ◎ |
| 101 | | 0.01 | 0.01 | 55 | 10 | ◎◎ | Δ | Δ | ○ | ○ | ◎ |
| 102 | | 0.05 | 0.05 | 70 | 11 | ◎◎ | ◎ | ◎ | ○ | ○ | ◎ |
| 103 | | 0.1 | — | 30 | 36 | ◎ | Δ | ◎ | Δ | ○ | ○ |
| 104 | | 0.15 | 0.0005 | 59 | 28 | ◎◎ | ◎ | ○ | Δ | ○ | ◎ |
| 105 | | 0.01 | — | 30 | 1.1 | ◎◎ | ◎ | Δ | Δ | ○ | ◎ |
| 106 | | 0.05 | 0.0005 | 60 | 1.4 | ◎◎ | ◎ | ◎ | Δ | ○ | ◎ |
| 107 | | 0.1 | 0.001 | 72 | 5.2 | ◎ | ◎ | ◎ | ○ | ○ | ◎ |
| 108 | | 0.15 | 0.003 | 30 | 5.5 | ◎ | ◎ | ○ | ○ | ○ | ◎ |
| 109 | | 0.01 | 0.01 | 55 | 12 | ◎◎ | ◎ | Δ | ○ | ○ | ◎ |
| Comparative Example 1 | | 0.008 | — | 20 | | X | Δ | Δ | Δ | ○ | Δ |
| 2 | Core material | 0.2 | 0.01 | 89 | | X | Δ | X | ◎ | ○ | ◎ |
| 3 | | 0.1 | 0.01 | 10 | | Δ | Δ | X | ◎ | ○ | Δ |
| 4 | | 0.18 | 0.01 | 62 | | X | Δ | Δ | ◎ | ○ | ◎ |
| 5 | | 0.2 | 0.01 | 25 | | X | Δ | X | ◎ | ○ | Δ |
| 6 | | 0.008 | 0.01 | 12 | | X | Δ | X | ◎ | ○ | Δ |
| 7 | | 0.1 | 0.01 | 10 | | Δ | Δ | X | ◎ | ○ | Δ |
| 8 | | 0.2 | 0.01 | 15 | | ◎ | Δ | X | ◎ | ○ | Δ |
| 9 | | 0.008 | 0.01 | 20 | | ◎ | Δ | X | ◎ | ○ | Δ |
| 10 | | 0.1 | 0.01 | 12 | | ◎ | Δ | X | ◎ | ○ | Δ |
| 11 | | 0.1 | — | 62 | | X | Δ | ◎ | Δ | ○ | ◎ |
| 12 | | 0.1 | 0.003 | 63 | | X | Δ | ◎ | ◎ | ○ | ◎ |

TABLE 1-continued

| 13 | 0.1 | —     | 63 | 5.4 | X | X | X | X | X | X |
| 14 | 0.1 | 0.003 | 64 | 11  | X | X | X | X | X | X |

(Method of Evaluation)

A crystal structure was evaluated with a surface of wire as an observation surface. An electron backscattered diffraction method (EBSD) was used as a method of evaluation. The EBSD method is characterized in that it can observe crystal orientations on an observation surface and graphically shows an angle difference of the crystal orientations between adjacent measurement points. The EBSD method can relatively easily observe the crystal orientations with high accuracy, even for a thin wire like the bonding wire.

Care should be taken when performing EBSD method with a curved surface like the wire surface as a subject. When a region with a large curvature is measured, measurement with high accuracy is difficult. However, a bonding wire to be measured is fixed to a line on a plane, and a flat part near the center of the bonding wire is measured, whereby measurement with high accuracy can be performed. Specifically, the following measurement region will work well. The size in the circumferential direction is 50% or less of the wire diameter with a center in the wire longitudinal direction as an axis, and the size in the wire longitudinal direction is 100 µm or less. Preferably, the size in the circumferential direction is 40% or less of the wire diameter, and the size in the wire longitudinal direction is 40 µm or less, whereby measurement efficiency can be improved by reducing a measurement time. In order to further improve accuracy, it is desirable that three or more points are measured to obtain average information with variations taken into account. The measurement sites may be apart from each other by 1 mm or more so as not to be close to each other.

The orientation proportion of <111> on surface was determined by calculating the proportion (areal percentage) of the crystal orientation <111> angled at 15 degrees or less to the longitudinal direction of the bonding wire with all crystal orientations identified by a dedicated software (OIM analysis manufactured by TSL Solutions, for example) as a population.

The bonding reliability of the ball bonded part in a high-temperature and high humidity environment or a high-temperature environment was determined by manufacturing a sample for bonding reliability evaluation, performing HAST and HTS evaluation, and by evaluating the bonding longevity of the ball bonded part in each test. The sample for bonding reliability evaluation was manufactured by performing ball bonding onto an electrode, which has been formed by forming an alloy of Al-1.0% Si-0.5% Cu as a film with a thickness of 0.8 µm on a Si substrate on a general metallic frame, using a commercially available wire bonder and sealing it with a commercially available epoxy resin. A ball was formed while flowing an $N_2$+5% $H_2$ gas at a flow rate of 0.4 to 0.6 L/min, and its size was a diameter of a range from 33 to 34 µm.

For the HAST evaluation, the manufactured sample for bonding reliability evaluation was exposed to a high-temperature and high-humidity environment of a temperature of 130° C. and a relative humidity of 85% using an unsaturated type pressure cooker tester and was biased with 5 V. A shear test on the ball bonded part was performed every 48 hours, and a time until a value of shear strength became half of the initial shear strength was determined to be the bonding longevity of the ball bonded part. The shear test after the high-temperature and high-humidity test was carried out after removing a resin by acid treatment and exposing the ball bonded part.

A tester manufactured by DAGE was used for a shear tester for the HAST evaluation. An average value of measurement values on 10 ball bonded parts randomly selected was used for the value of the shear strength. In the above evaluation, the bonding longevity being less than 96 hours was determined to be practically problematic to be marked with a symbol of "cross," being 96 hours or more and less than 144 hours was determined to be practicable but somewhat problematic to be marked with a symbol of "triangle," being 144 hours or more and less than 288 hours was determined to be practically no problem to be marked with a symbol of "circle," being 288 hours or more and less than 384 hours was determined to be excellent to be marked with a symbol of "double circle," and being 384 hours or more was determined to be especially excellent to be marked with a symbol of "a pair of double circle" in the column "HAST" in Table 1.

For the HTS evaluation, the manufactured sample for bonding reliability evaluation was exposed to a high-temperature environment of a temperature of 200° C. using a high-temperature thermostatic device. A shear test on the ball bonded part was performed every 500 hours, and a time until a value of shear strength became half of the initial shear strength was determined to be the bonding longevity of the ball bonded part. The shear test after the high-temperature and high-humidity test was performed after removing a resin by acid treatment and exposing the ball bonded part.

A tester manufactured by DAGE was used for a shear tester for the HTS evaluation. An average value of measurement values on 10 ball bonded parts randomly selected was used for the value of the shear strength. In the above evaluation, the bonding longevity being 500 or more to less than 1,000 hours was determined to be practicable but desirably to be improved to be marked with a symbol of "triangle," being 1,000 or more to less than 3,000 hours was determined to be practically no problem to be marked with a symbol of "circle," and being 3,000 hours or more was determined to be especially excellent to be marked with a symbol of "double circle."

For the evaluation of ball formability (FAB shape), a ball before performing bonding was collected and observed, and the presence or absence of voids on a surface of the ball and the presence or absence of deformation of the ball, which is primarily a perfect sphere. The occurrence of any of the above was determined to be faulty. The formation of the ball was performed while an $N_2$ gas was sprayed at a flow rate of 0.5 L/min in order to reduce oxidation in a melting process. The size of the ball was 34 µm. For one condition, 50 balls were observed. A SEM was used for the observation. In the evaluation of the ball formability, a case where five or more failures occurred was determined to be problematic to be marked with a symbol of "cross," a case of three or four failures was determined to be practicable but somewhat problematic to be marked with a symbol of "triangle," a case of one or two failures was determined to be no problem to be marked with a symbol of "circle," and a case where no failure occurred was determined to be excellent to be marked with a symbol of "double circle" in the column "FAB shape" in Table 1.

The evaluation of wedge bondability on the wire bonded part was determined by performing 1,000 pieces of bonding on leads of a lead frame and evaluating by the occurrence frequency of peeling of the bonded part. An Fe-42 at % Ni alloy lead frame plated with 1 to 3 μm Ag was used for the lead frame. In this evaluation, assuming more rigorous bonding conditions than normal, a stage temperature was set to be 150° C., which was lower than a generally set temperature range. In the above evaluation, a case where 11 or more failures occurred was determined to be problematic to be marked with a symbol of "cross," a case of 6 to 10 failures was determined to be practicable but somewhat problematic to be marked with a symbol of "triangle," a case of 1 to 5 failures was determined to be no problem to be marked with a symbol of "circle," and a case where no failure occurred was determined to be excellent to be marked with a symbol of "double circle" in the column "wedge bondability" in Table 1.

The evaluation of a crushed shape of the ball bonded part was determined by observing the ball bonded part from immediately above after bonding and evaluating by its circularity. For an object to be bonded with the bonding wire, an electrode in which an Al-0.5% Cu alloy was formed as a film with a thickness of 1.0 μm on a Si substrate was used. The observation was performed using an optical microscope, and 200 sites were observed for one condition. Being elliptic with large deviation from a perfect circle and being anisotropic in deformation were determined to be faulty in the crushed shape of the ball bonded part. In the above evaluation, a case where six or more failures occurred was determined to be problematic to be marked with a symbol of "cross," a case of four or five failures was determined to be practicable but somewhat problematic to be marked with a symbol of "triangle," being one to three was determined to be no problem to be marked with a symbol of "circle," and a case where a favorable perfect circle was obtained for all was determined to be especially excellent to be marked with a symbol of "double circle" in the column "crushed shape" in Table 1.

[Leaning]

To a lead frame for evaluation, 100 pieces of bonding were performed with a loop length of 5 mm and a loop height of 0.5 mm. As a method of evaluation, a wire upright part was observed from a chip horizontal direction, and evaluation was performed based on spacing when spacing between a perpendicular line passing through the center of the ball bonded part and the wire upright part was maximized (leaning spacing). If the leaning spacing was smaller than the wire diameter, leaning was determined to be favorable, whereas if the leaning spacing was larger, the upright part leaned, and the leaning was determined to be faulty. One hundred bonded wires were observed with an optical microscope, and the number of leaning failures was counted. A case where seven or more failures occurred was determined to be problematic to be marked with a symbol of "cross," a case of four to six failures was determined to be practicable but somewhat problematic to be marked with a symbol of "triangle," a case of one to three failures was determined to be no problem to be marked with a symbol of "circle," and a case in which no failure occurred was determined to be excellent to be marked with a symbol of "double circle" in the column "leaning" in Table 1.

(Evaluation Results)

The bonding wires according to Working Examples 1 through 109 each include a Cu alloy core material and a Pd coating layer formed on the surface of the Cu alloy core material, and the bonding wire contains at least one or more elements selected from As, Te, Sn, Sb, Bi and Se, a concentration of the elements in total is 0.1 to 100 ppm by mass relative to the entire wire. It has been revealed that with this configuration the bonding wires according to Working Examples 1 through 109 can achieve the reliability of the ball bonded part in the HAST test in the high-temperature and high-humidity environment of a temperature of 130° C. and a relative humidity of 85%.

In contrast, in Comparative Examples 1, 2, 4 through 6, and 11 through 14, a concentration of the elements was out of the lower limit, and the reliability of the ball bonded part was not obtained in the HAST test. In Comparative Examples 3 and 7 through 10, a concentration of the elements was out of the upper limit, and the FAB shape was faulty. In Comparative Examples 1, 3, and 5 through 10, the areal percentage of the crystal orientation <111> was out of the preferable range of the present invention, and the evaluation result of the leaning was a symbol of "triangle."

In the working examples further including an alloy skin layer containing Au and Pd on the Pd coating layer, it has been revealed that excellent wedge bondability can be obtained when a thickness of the alloy skin layer containing Au and Pd is 0.0005 to 0.050 μm.

In Working Examples 27 through 92, 100, 102, and 104 through 109, it has been revealed that the high-temperature reliability of the ball bonded part by the HTS evaluation is favorable because the bonding wire further contains at least one or more elements selected from Ni, Zn, Rh, In, Ir, Pt, Ga, Ge and Pd, and a concentration of each of the elements other than Pd is 0.011 to 1.2% by mass relative to the entire wire, and a concentration of Pd contained in the Cu alloy core material is 0.05 to 1.2% by mass.

In some of Working Examples 28 through 92, the FAB shape was favorable and the wedge bondability was favorable when the bonding wire further contains at least one or more elements selected from B, P, Mg, Ca and La, and a concentration of each of the elements is 1 to 100 ppm by mass relative to the entire wire.

In Working Examples 99 through 109, the wire contains As, Te, Sn, Sb, Bi and Se, and Cu was present at an outermost surface of the wire. With this configuration, Working Examples 99, 101, 103, 105, 106, 108, and 109 were a symbol of "a pair of double circle" or a symbol of "double circle" in the HAST evaluation results, which revealed the effect of causing Cu to be present at an outermost surface. In Working Examples 100, 102, 104, and 107, in addition, the purity of Cu of the wire was as low as 2N or less, and all of them were extremely favorable in the HAST evaluation results, a symbol of "a pair of double circle." In contrast, these working examples revealed a slight decrease in the wedge bondability.

In Comparative Examples 13 and 14, not only the HAST evaluation but also the HTS evaluation results were faulty, the FAB shape and the crushed shape were faulty, and further the wedge bondability and the leaning also degraded because the wire did not contain As, Te, Sn, Sb, Bi and Se, while Cu was present at an outermost surface of the wire.

The invention claimed is:

1. A bonding wire for a semiconductor device comprising:
a Cu alloy core material; and
a Pd coating layer formed on a surface of the Cu alloy core material, wherein
the bonding wire contains at least one or more first elements selected from Sb, Bi and Se, a concentration of the first elements in total is 0.1 ppm by mass or more and 100 ppm by mass or less relative to the entire wire, and Sb≤10 ppm by mass; and Bi≤1 ppm by mass, and the bonding wire contains at least one or more second elements selected from Ni, Zn, Rh, In, Ir, Pt, Ga and Ge, and a concentration of each of the second elements is 0.011% by mass or more and 1.2% by mass or less relative to the entire wire.

2. The bonding wire for a semiconductor device according to claim 1, wherein the concentration of the at least one or more first elements selected from Sb, Bi and Se in total is 1 ppm by mass or more and 100 ppm by mass or less relative to the entire wire.

3. The bonding wire for a semiconductor device according to claim 1, wherein a thickness of the Pd coating layer is 0.015 μm or more and 0.150 μm or less.

4. The bonding wire for a semiconductor device according to claim 1, further comprising an alloy skin layer containing Au and Pd on the Pd coating layer.

5. The bonding wire for a semiconductor device according to claim 4, wherein a thickness of the alloy skin layer containing Au and Pd is 0.0005 μm or more and 0.050 μm or less.

6. The bonding wire for a semiconductor device according to claim 1, wherein the Cu alloy core material contains Pd, and a concentration of Pd contained in the Cu alloy core material is 0.05% by mass or more and 1.2% by mass or less.

7. The bonding wire for a semiconductor device according to claim 1, wherein the bonding wire further contains at least one or more third elements selected from B, P, Mg, Ca and La, and a concentration of each of the third elements is 1 ppm by mass or more and 100 ppm by mass or less relative to the entire wire.

8. The bonding wire for a semiconductor device according to claim 1, wherein, in a measurement result when measuring crystal orientations on a surface of the bonding wire, a crystal orientation <111> angled at 15 degrees or less to a longitudinal direction of the bonding wire has a proportion of 30% or more and 100% or less.

9. The bonding wire for a semiconductor device according to claim 1, wherein Cu is present at an outermost surface of the bonding wire.

10. The bonding wire for a semiconductor device according to claim 1, wherein a concentration of Sb is 9.9 ppm by mass or less relative to the entire wire.

11. A bonding wire for a semiconductor device comprising:

a Cu alloy core material; and a Pd coating layer formed on a surface of the Cu alloy core material, wherein the bonding wire contains at least one or more first elements selected from Sb, Bi and Se, and when containing Sb, a concentration of Sb is 2.2 ppm by mass or more and 10 ppm by mass or less relative to the entire wire, when containing Bi, a concentration of Bi is 0.2 ppm by mass or more and 1 ppm by mass or less relative to the entire wire, and when containing Se, a concentration of Se is 1.2 ppm by mass or more and 4.9 ppm by mass or less relative to the entire wire.

12. The bonding wire for a semiconductor device according to claim 11, wherein the bonding wire further contains at least one or more second elements selected from Ni, Zn, Rh, In, Ir, Pt, Ga and Ge, and a concentration of each of the second elements is 0.011% by mass or more and 1.2% by mass or less relative to the entire wire.

13. The bonding wire for a semiconductor device according to claim 11, wherein the concentration of the at least one or more first elements selected from Sb, Bi and Se in total is 1 ppm by mass or more relative to the entire wire.

14. The bonding wire for a semiconductor device according to claim 11, wherein a thickness of the Pd coating layer is 0.015 μm or more and 0.150 μm or less.

15. The bonding wire for a semiconductor device according to claim 11, further comprising an alloy skin layer containing Au and Pd on the Pd coating layer.

16. The bonding wire for a semiconductor device according to claim 15, wherein a thickness of the alloy skin layer containing Au and Pd is 0.0005 μm or more and 0.050 μm or less.

17. The bonding wire for a semiconductor device according to claim 11, wherein the Cu alloy core material contains Pd, and a concentration of Pd contained in the Cu alloy core material is 0.05% by mass or more and 1.2% by mass or less.

18. The bonding wire for a semiconductor device according to claim 11, wherein the bonding wire further contains at least one or more third elements selected from B, P, Mg, Ca and La, and a concentration of each of the third elements is 1 ppm by mass or more and 100 ppm by mass or less relative to the entire wire.

19. The bonding wire for a semiconductor device according to claim 11, wherein, in a measurement result when measuring crystal orientations on a surface of the bonding wire, a crystal orientation <111> angled at 15 degrees or less to a longitudinal direction of the bonding wire has a proportion of 30% or more and 100% or less.

20. The bonding wire for a semiconductor device according to claim 11, wherein Cu is present at an outermost surface of the bonding wire.

21. The bonding wire for a semiconductor device according to claim 11, wherein a concentration of Sb is 9.9 ppm by mass or less relative to the entire wire.

* * * * *